United States Patent [19]

Blake

[11] Patent Number: 5,554,854

[45] Date of Patent: Sep. 10, 1996

[54] IN SITU REMOVAL OF CONTAMINANTS FROM THE INTERIOR SURFACES OF AN ION BEAM IMPLANTER

[75] Inventor: Julian G. Blake, Beverly Farms, Mass.

[73] Assignee: Eaton Corporation, Cleveland, Ohio

[21] Appl. No.: 503,299

[22] Filed: Jul. 17, 1995

[51] Int. Cl.$^6$ .................................................. H01J 37/36
[52] U.S. Cl. .................................. 250/492.21; 250/492.2
[58] Field of Search .......................... 250/492.21, 492.2, 250/398

[56] References Cited

U.S. PATENT DOCUMENTS

| | | | |
|---|---|---|---|
| 4,022,928 | 5/1977 | Piwcyzk | 427/43 |
| 4,665,315 | 5/1987 | Bacchetti et al. | 250/492.21 |
| 4,764,394 | 8/1988 | Conrad | 427/38 |
| 4,847,504 | 7/1989 | Aitken | 250/492.21 |
| 4,914,292 | 4/1990 | Tamai et al. | 250/251 |
| 4,987,933 | 1/1991 | Mack | 141/7 |
| 5,030,835 | 7/1991 | Tamai et al. | 250/492.2 |
| 5,144,147 | 9/1992 | Shiozaki et al. | 250/492.21 |
| 5,164,599 | 11/1992 | Benveniste | 250/492.2 |
| 5,308,989 | 5/1994 | Brubaker | 250/441.11 |
| 5,420,435 | 5/1995 | Garza | 250/492.21 |
| 5,427,621 | 6/1995 | Gupta | 134/1 |
| 5,466,942 | 11/1995 | Sakai et al. | 250/492.21 |

FOREIGN PATENT DOCUMENTS

| | | |
|---|---|---|
| 0140975 | 9/1984 | European Pat. Off. . |
| 0648861 | 4/1995 | European Pat. Off. . |

OTHER PUBLICATIONS

Materials Research Corporation, "The Basics of Plasma," Hinson, Copyright 1984, pp. 1–36.

Primary Examiner—Jack I. Berman
Assistant Examiner—Kiet T. Nguyen
Attorney, Agent, or Firm—Watts, Hoffmann, Fisher & Heinke Co., L.P.A.

[57] ABSTRACT

An in situ method of removing contaminant material adhering to interior surfaces of an ion beam implanter is disclosed. The method includes the steps of: extracting ions from source materials and forming the ions into an ion beam that traverses a beam path through an evacuated region to an ion implantation chamber; providing a control means for controlling a trajectory of the ion beam within the evacuated region; utilizing the control means to direct the ion beam to strike interior surfaces of the ion beam implanter in contact with the evacuated region to dislodge the contaminant material; and removing the contaminant material from the evacuated region of the implanter.

36 Claims, 5 Drawing Sheets

IN SITU REMOVAL OF CONTAMINANTS FROM THE INTERIOR SURFACES OF AN ION BEAM IMPLANTER

FIELD OF INVENTION

The present invention concerns removal of contaminant materials adhering to interior surfaces of an ion beam implanter and, more particularly, to a method for using the ion beam to remove contaminant materials in an ion beam implanter.

BACKGROUND OF THE INVENTION

Ion beam implanters are used to implant or "dope" silicon wafers with impurities to produce n or p type extrinsic materials. The n and p type extrinsic materials are utilized in the production of semiconductor integrated circuits. As its name implies, the ion beam implanter dopes the silicon wafers with a selected ion species to produce the desired extrinsic material. Implanting ions generated from source materials such as antimony, arsenic or phosphorus results in n type extrinsic material wafers. If p type extrinsic material wafers are desired, ions generated with source materials such as boron, gallium or indium will be implanted.

The ion beam implanter includes an ion source for generating positively charged ions from ionizable source materials. The generated ions are formed into a beam and accelerated along a predetermined beam path to an implantation station. The ion beam implanter includes beam forming and shaping structure extending between the ion source and the implantation station. The beam forming and shaping structure maintains the ion beam and bounds an elongated interior cavity or region through which the beam passes en route to the implantation station. When operating the implanter, the interior region must be evacuated to reduce the probability of ions being deflected from the predetermined beam path as a result of collisions with air molecules.

Ion beam implanters have recently been proposed for use in fabricating flat panel displays. Flat panel displays are frequently used in portable personal computers. The displays of such computers do not have a cathode ray tube for displaying text and graphics. Instead, a glass substrate covered with an amorphous silicon solid supports an electrode array for activating discrete picture elements (pixels) of the display. During fabrication the glass is covered with a resistive pattern and then inserted into an implantation chamber so that the ion beam from the source can treat the flat display. This use of an ion implanter requires a larger cross section ion beam to implant an entire width of the flat panel display.

For existing high current ion implanters, the wafers at the implantation station are mounted on a surface of a rotating support. As the support rotates, the wafers pass through the ion beam. Ions traveling along the beam path collide with and are implanted in the rotating wafers. A robotic arm withdraws wafers to be treated from a wafer cassette and positions the wafers on the wafer support surface. After treatment, the robotic arm removes the wafers from the wafer support surface and redeposits the treated wafers in the wafer cassette. In the proposed use of an ion implanter for flat panel displays, the panels are mounted to a support that positions the panel within an extended area ion beam formed by multiple exit apertures in a source.

Operation of an ion implanter results in the production of certain contaminant materials. These contaminant materials adhere to surfaces of the implanter beam forming and shaping structure adjacent the ion beam path and also on the surface of the wafer support facing the ion beam. Contaminant materials include undesirable species of ions generated in the ion source, that is, ions having the wrong atomic mass.

Another source of contaminant materials results from operating the implanter to implant different species of ions in consecutive implants. It is common practice to use the same implanter for implants utilizing different ions. For example, the implanter may be utilized to implant a quantity of wafers with boron ions having an AMU of 11 (atomic mass units). The boron implant may be followed by an implant of arsenic ions having an AMU of 75. Such consecutive implants with different ion species may lead to contamination of the second implant wafers with ions from the first implant. This is referred to as "cross specie contamination."

Another contaminant is photoresist material. Photoresist material is coated on the wafer surfaces prior to ion beam treatment of the wafer and is required to define circuitry on the completed integrated circuit. As ions strike the wafer surface, particles of the photoresist coating are dislodged from the wafer and settle on the wafer support surface or adjacent interior surfaces of the beam forming and shaping structure.

Over time, the contaminant materials build up on the beam forming and shaping structure and the wafer support surface and decrease the efficiency of the ion beam implanter and the quality of the treated wafers. As the contaminant materials build up on the implanter component surfaces, upper layers of contaminant materials flake off or are dislodged by ions which strike the contaminant materials, creating discharges and contaminating the implantation of the wafers. Some of the dislodged contaminant material moves along the beam path to the implantation station and is implanted in the wafers. Such contaminant material changes the electrical properties of the wafers. Even a small amount of contaminant material may render the implanted wafers unsuitable for their intended purpose in the manufacture of integrated circuits.

Additionally, buildup of contaminant materials on the interior surfaces of the ion implanter will reduce the efficiency of certain beam forming and shaping components. For example, the ion beam passes through an ion beam neutralization apparatus which partially neutralizes the positively charged ion beam such that the implanted wafers are not charged by the beam. The ion beam neutralization apparatus produces secondary electron emissions to partially neutralize the positively charged ions as they pass through the apparatus. A build up of contaminant materials on the interior surfaces of the ion beam neutralization apparatus impedes the secondary electron emission process.

The contaminants deposited on the implanter interior surfaces must be periodically removed. Removing contaminant materials from the beam forming and shaping structure and the wafer support requires disassembly of the ion beam implanter. The contaminated components are removed from the implanter and carried to a cleaning station since certain dopant materials are toxic. Component surfaces are scrubbed with solvents and abrasives to remove the contaminant materials. The implanter is then reassembled and tested prior to resuming wafer treatment.

This cleaning procedure represents a significant economic cost in terms of implanter down time. In addition to the time required for cleaning the components, reassembly of the implanter is a slow process. Precise alignment of the implanter components must be achieved for proper operation of the implanter. Additionally, the vacuum in the interior region of the implanter must be reestablished prior to operation. Finally, it is standard operating procedure not to allow a production run on an implanter that has been disassembled until it is requalified by implanting test wafers and evaluating the wafers.

DISCLOSURE OF THE INVENTION

The present invention provides for in situ removal of contaminant material adhering to interior surfaces of an ion beam implanter. In such an ion beam implanter ions are extracted from a source material and form an ion beam that traverses a beam path. Ions from the beam dislodge the contaminant material from an evacuated region of the implanter and then removed from the implanter.

In accordance with one embodiment of the invention the implanter includes a mass analyzing magnet for generating a magnetic field through which the ion beam passes on its way to an implantation chamber. The mass analyzing magnet is tunable to alter a direction of the ion beam as the beam passes through the magnetic field. An implanter controller causes the ion beam to strike interior surfaces of the beam implanter by slightly mis-tuning the mass analyzing magnet.

The implanter also includes a set of electrodes disposed around a portion of the ion beam path that are adjustably energized to alter a direction of the ion beam as the beam passes through the set of electrodes. The controller causes the ion beam to strike interior surfaces of the beam implanter by adjusting the electrode potential.

Advantageously, the controller varies the tuning of the mass analyzing magnet in a selected repetitive pattern such that the ion beam repetitively sweeps over the surfaces to be cleaned. Similarly, the electrode potential may be repetitively changed to effect a repetitive sweeping of the ion beam over the surfaces to be cleaned.

The control means also includes ion beam neutralization apparatus generating a secondary electron emission field through which the ion beam passes. The neutralization apparatus is energized to increase a divergence of the beam as its passes through the electron field causing ions within the beam to strike downstream surfaces of the ion beam neutralization apparatus and portions of the wafer support surface facing the ion beam.

An ion implanter constructed in accordance With one embodiment of the invention includes an ion source for emitting ions from a source chamber having one or more ion exit apertures. The ions are extracted from the source chamber by electrodes positioned in relation to the one or more ion exit apertures of the source chamber for causing ions exiting the source chamber to form an ion beam. Ion beam defining structure bounds an evacuated region that defines an ion beam travel path from the electrode structure. An ion implantation chamber includes structure for supporting a workpiece that intercepts ions entering the implantation chamber after traversing the beam travel path from the source to the implantation chamber.

A source introduces materials into the ion implanter that interact with contaminants that contact structure bounding evacuated regions of the ion beam implanter during ion beam treatment of workpieces. An implantation controller controls the ion beam as it moves through the evacuated region from the source to the implantation chamber. A pump removes dislodged contaminant material from the evacuated region of the ion implanter.

Preferably, a source material is utilized which produces ions which chemically bond with the dislodged contaminant material to form volatile species of the contaminant material that is removed by the pump.

These and other objects, advantages and features of the invention will become better understood from a detailed description of a preferred embodiment of the invention which is described in conjunction with the accompanying drawings.

BEST MODE FOR PRACTICING THE INVENTION

OPERATION OF IMPLANTER

Figure 1:
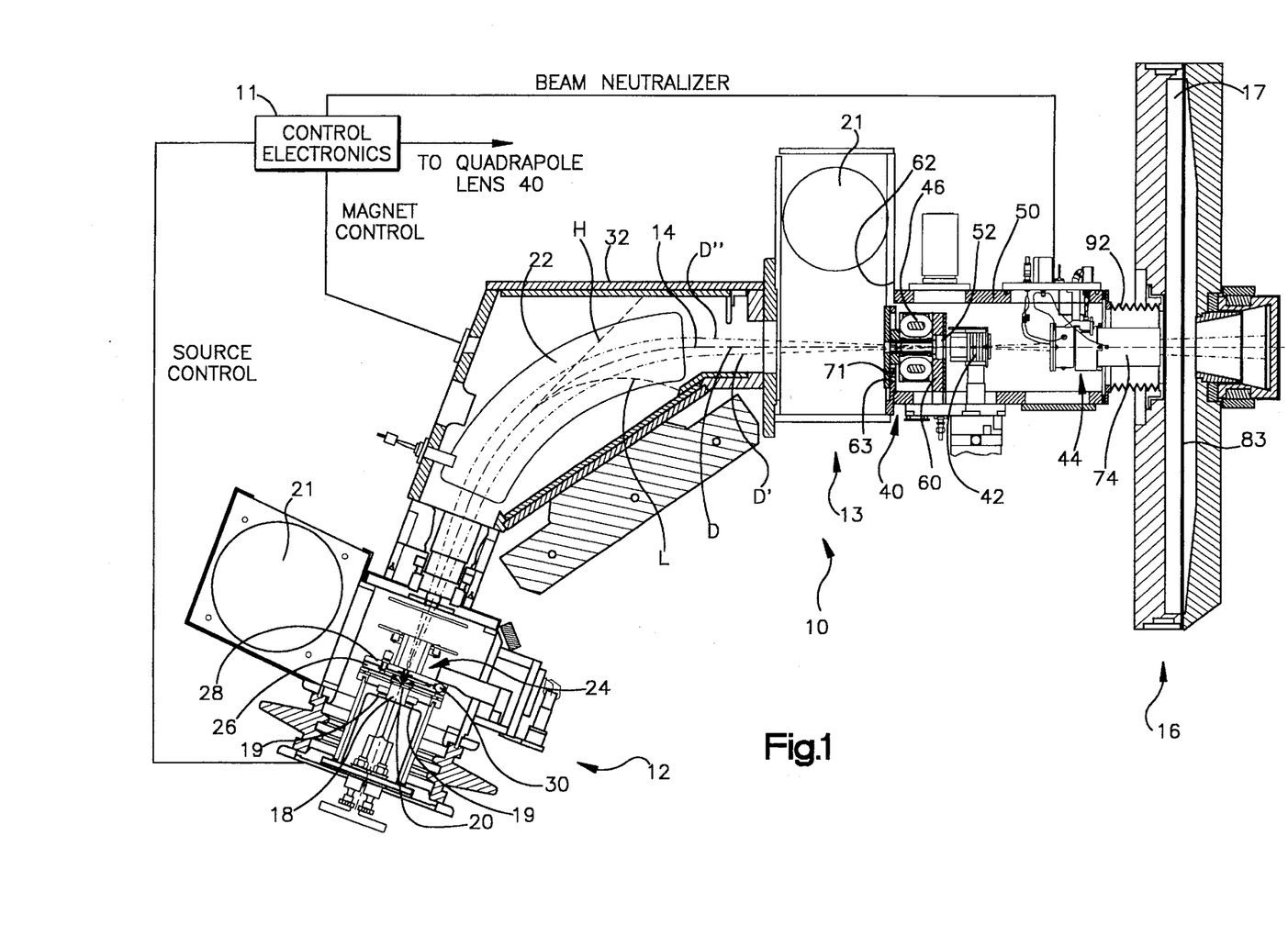
FIG. 1 is a top view, partly in section, showing an ion beam implanter including an ion source, beam forming and shaping structure and an implantation chamber.

Turning now to the drawings, FIG. 1 depicts an ion beam implanter, shown generally at 10, which includes an ion source 12, structure, shown generally at 13, for forming and shaping an ion beam 14 and an implantation station 16. Control electronics 11 monitor and control the ion dosage received by the wafers (not shown) within an implantation chamber 17 at the implantation station 16. The ions in the ion beam follow a predetermined, desired beam path labeled D in FIG. 1. The beam path D has varying amounts of divergence as the beam traverses the distance between the ion source 12 and the implantation station 16. The "limits" of the predetermined beam path D caused by beam divergence have been labeled D' and D" respectively in FIG. 1.

The ion source 12 includes a plasma chamber 18 defining an interior region into which source materials are injected. The source materials may include an ionizable gas or vaporized source material. Source material in solid form is deposited into a pair of vaporizers 19. The vaporized source material is then injected into the plasma chamber. If an n type extrinsic wafer material is desired, boron, gallium or indium will be used. Gallium and indium are solid source materials, while boron is injected into the plasma chamber 18 as a gas, typically boron trifluoride or diborane, because boron's vapor pressure is too low to result in a usable pressure by simply heating it.

If a p type extrinsic material is to be produced, antimony, arsenic or phosphorus will be chosen as the solid source material. Energy is applied to the source materials to generate positively charged ions in the plasma chamber 18. The positively charged ions exit the plasma chamber interior through an elliptical arc slit in a cover plate 20 overlying an open side of the plasma chamber 18.

An ion source utilizing microwave energy to ionize source materials is disclosed in U.S. patent application Ser. No. 08/312,142, filed Sep. 26, 1994, which is assigned to the assignee of the instant application. U.S. patent application Ser. No. 08/312,142 is incorporated herein in its entirety by reference. The ion beam 14 travels through an evacuated path from the ion source 12 to the implantation chamber 17, which is also evacuated. Evacuation of the beam path is provided by vacuum pumps 21.

Ions in the plasma chamber 18 are extracted through the arc slit in the plasma chamber cover plate 20 and accelerated toward a mass analyzing magnet 22 by multiple electrodes 24 adjacent the plasma chamber cover plate 20. The electrodes 24 extract the ions from the plasma chamber interior and accelerate the ions into a region bounded by the mass analyzing or resolving magnet 22. The set of electrodes 24 includes a suppression electrode 26 and an extraction electrode 28 spaced apart from the suppression electrode by a set of three spherical insulators 30 (only one of which can be seen in FIG. 1). During operation of the implanter, the suppression electrode 26 is energized at a negative voltage to minimize backstreaming of ions exiting the plasma chamber 18. The plasma chamber 18 is energized by the control electronics 11 at a high positive potential and the extraction electrode 28 is set to ground potential to extract positive ions from the plasma chamber 18. Each electrode 26, 28 is comprised of matching semicircular disk halves which are spaced apart to define a gap through which the ions pass.

Ions in traveling along the ion beam 14 move from the ion source 12 into a magnetic field set up by the mass analyzing magnet 22. The mass analyzing magnet is part of the ion beam forming and shaping structure 13 and is supported within a magnet housing 32. The strength and orientation of the magnetic field is controlled by the control electronics 11. The mass analyzing magnet 22 includes a magnet yoke (not shown) bounded by field windings (also not shown). The magnet's field is controlled by adjusting a current through the magnet's field windings. Along the ion beam travel path from the mass analyzing magnet 22 to the implantation station 16, the ion beam 14 is further shaped and evaluated. The ions are accelerated due to the potential drop from the high voltage of the mass analyzing magnet housing 32 to the grounded implantation chamber 17.

The mass analyzing magnet 22 causes only those ions having an appropriate mass to reach the ion implantation station 16. The ionization of source materials in the plasma chamber 18 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation and are referred to as undesirable species.

The magnetic field generated by the mass analyzing magnet 22 causes the ions in the ion beam to move in a curved trajectory. The magnetic field is established such that only ions having an atomic mass equal to the atomic mass of the desired ion species traverse the beam path to the implantation station chamber 17.

The desired species moves along the path D, or more correctly, within the ion beam path "envelope" defined by D' and D" since there is always some degree of beam divergence as a result of the repulsive force of like charged ions (all the ions having a positive charge).

In FIG. 1, a path labeled "H" illustrates a trajectory path of an undesirable ion which has an atomic mass much heavier (approximately 50% heavier) in atomic mass than the desired ion species being implanted. A path labeled "L" illustrates a trajectory path of an undesirable ion which has an atomic mass much lighter (approximately 50% lighter) in atomic mass than the desired ion species being implanted. The undesirable ions which have an atomic mass much lighter or much heavier than the atomic mass of the desired ion species diverge sharply from the predetermined, desired beam path D when passing through the mass analyzing magnet magnetic field and impact the mass analyzing magnet housing 32.

The ion beam forming and shaping structure 13 further includes a quadruple assembly 40, a pivoting Faraday cup 42 and an ion beam neutralizer 44. The quadruple assembly 40 includes set of magnets 46 oriented around the ion beam 14 which are selectively energized by the control electronics (not shown) to adjust the height of the ion beam 14. The quadruple assembly 40 is supported within a housing 50 located between the chamber 17 and the magnet 22.

Figure 3:
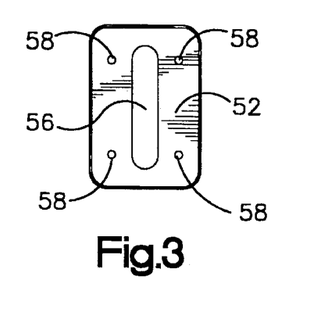
FIG. 3 is a front elevation view of an ion beam resolving plate of the quadruple assembly of FIG. 2 as viewed from the plane indicated by the line 3—3 in FIG. 2.

Coupled to an end of the quadruple assembly 40 facing the Faraday flag 42 is an ion beam resolving plate 52. The resolving plate 52 is comprised of vitreous graphite and is shown in FIG. 3. The resolving plate 52 includes an elongated aperture 56 through which the ions in the ion beam 14 pass as they exit the quadruple assembly 40. The resolving plate 52 also includes four counterbored holes 58. Screws (not shown) fasten the resolving plate 52 to the quadruple assembly 40. At the resolving plate 52 the ion beam dispersion, as defined by the width of the envelope D', D", is at its minimum value, that is, the width of D' D" is at a minimum where the ion beam 14 passes through the resolving plate aperture 56.

The resolving plate 52 functions in conjunction with the mass analyzing magnet 22 to eliminate undesirable ion species from the ion beam 14 which have an atomic mass close to, but not identical, to the atomic mass of the desired species of ions. As explained above, the strength and orientation of the mass analyzing magnet's magnetic field is established by the control circuitry 11 such that only ions having an atomic weight equal to the atomic weight of the desired species will traverse the predetermined, desired beam path D to the implantation station 16. Undesirable species of ions having an atomic mass much larger or much smaller than the desired ion atomic mass are sharply deflected and impact the housing 50.

However, if the atomic mass of an undesirable ion is "close" to the atomic mass of the desired species, the trajectory of the undesirable ion will be only slightly deflected from the desired beam path D. Such an undesirable ion having only a slight deflection from the desired beam path D would impact an upstream facing surface of the resolving plate 52. Over time, undesirable species of ions which impact the resolving plate 52 build up on the plate.

For example, implanting wafers with boron ions to produce p type extrinsic material is a typical implanter operation. The desired implantation species is an ion including boron 11, that is, ions having boron with a mass of eleven atomic mass units. However, experience has shown that ionizing source materials including vaporized boron in the plasma chamber 18 also generates ions having another boron isotope, boron 10, that is, boron with a mass of ten atomic mass units. Ions including boron 10 are an undesirable species.

Since the atomic mass of the two isotopes (boron 10 and boron 11) differs by only 10%, the trajectory of the undesirable ion species including the boron 10 isotope is close to the trajectory of the desired boron 11 ion beam line D. However, because of the mass difference the ions including boron 10 are slightly "off" from the desired beam line D and, therefore, impact the resolving plate 52. The ions including the boron 10 isotope are prevented by the resolving plate 52 from reaching the implantation station 16 and being implanted in a wafer.

Figure 2:
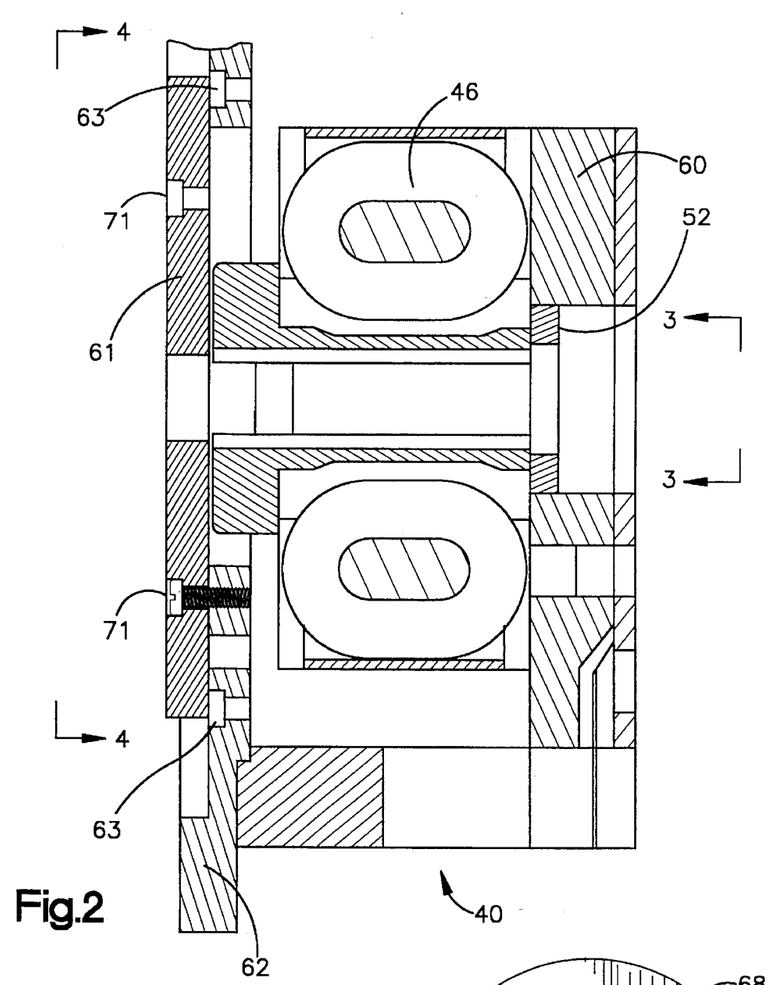
FIG. 2 is an enlarged top plan view of a quadruple assembly of the ion beam implanter of FIG. 1.

The quadruple assembly 40 is supported by a support bracket 60 and a support plate 62. The support bracket 60 is coupled to an interior surface of the housing 50 while the support plate 62 is coupled to an end of the housing 50 via a plurality of screws (two screws 63 fastening the support plate 62 to the housing 50 is seen in FIG. 2). Attached to the support plate 62 is a quadruple assembly shield plate 64 (shown in FIG. 4). The quadruple assembly shield plate 64 is comprised of vitreous graphite and includes a rectangular aperture 66 and four counterbored holes 68. The counterbored holes 68 accept screws which secure the quadruple assembly shield plate 64 to the support plate 62 (two screws 71 extending through two of the counterbored holes 68 and into the support plate 62 is seen in FIG. 2).

Figure 4:
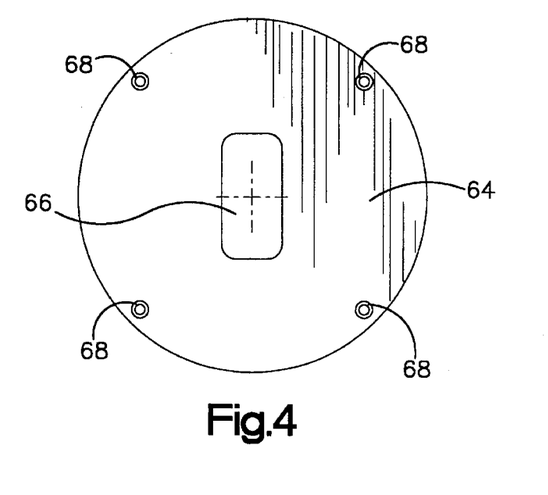
FIG. 4 is a front elevation view of an quadruple assembly shield of the quadruple assembly of FIG. 2 as viewed from the plane indicated by the line 4—4 in FIG. 2.

The quadruple assembly shield plate 64 protects the quadruple assembly 40 from impact by undesirable ions having an atomic mass that is "close" enough to the atomic mass of the desired ion species to avoid impact with the housing 50 after passing through the mass analyzing magnet magnetic field yet different enough from the atomic mass of the desired species to be deflected by the magnetic field to a greater extent than those ions impacting the resolving plate 52. During operation of the implanter 10, undesirable ions impacting an upstream facing surface of the quadruple assembly shield plate 64 build-up on the plate.

As can be seen in FIG. 1, the Faraday flag 42 is located between the quadruple assembly 40 and the ion beam neutralization apparatus 44. The Faraday flag is pivotably coupled to the housing 50 so that it can be pivoted into position to intersect the ion beam 14 to measure beam characteristics. When the control electronics 11 determines the beam characteristics are satisfactory for ion implantation, the electronics 11 causes the Faraday flag to be swung out of the beam line so as to not interfere with wafer implantation at the implantation chamber 17.

The beam forming structure 13 also includes the ion beam neutralization apparatus 44, commonly referred to as an electron shower. U.S. Pat. No. 5,164,599 to Benveniste, issued Nov. 17, 1992, discloses an electron shower apparatus in an ion beam implanter and is incorporated herein in its entirety by reference. The ions extracted from the plasma chamber 18 are positively charged. If the net positive charge of the ion beam is not neutralized prior to implantation of the wafers, the doped wafers will exhibit a net positive charge. As described in the '599 patent, such a net positive charge on a wafer has undesirable characteristics.

Figure 5:
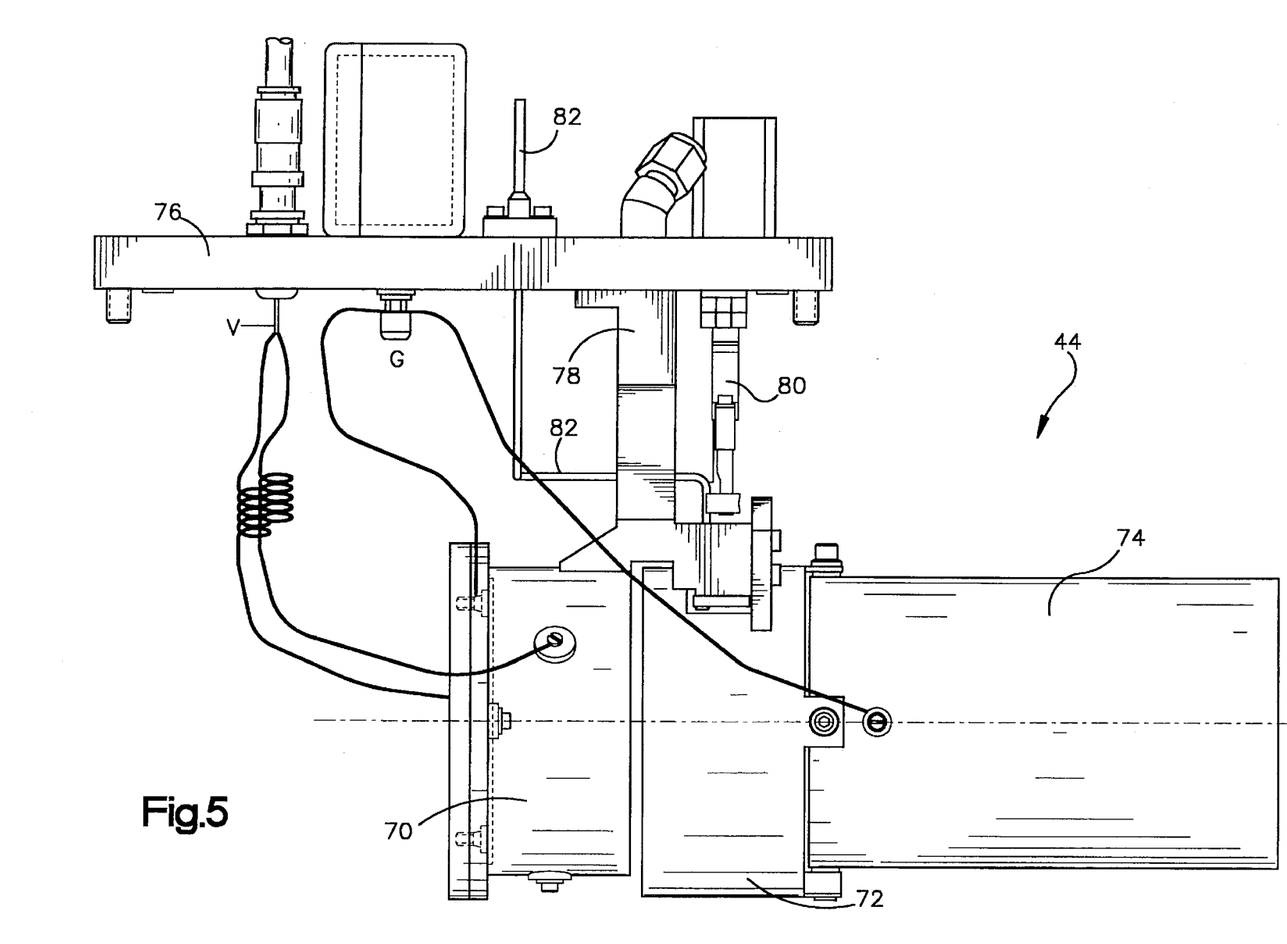
FIG. 5 is an enlarged top plan view of an ion beam neutralization apparatus of the ion beam implanter of FIG. 1.

The ion beam neutralization apparatus 44 shown in FIG. 5 includes a bias aperture 70, a target 72 and an extension tube 74. Each of the bias aperture 70, the target 72 and the extension tube 74 are hollow and when assembled define an open ended, cylindrical interior region through which the ion beam 14 passes and is neutralized by secondary electron emissions. The neutralizer apparatus 44 is positioned with respect to the housing 50 by a mounting flange 76 connected to the housing 50.

Extending from the mounting flange 76 is a support member 78 for the bias aperture 70. The target 72 is secured to the support member 78. The extension tube 74 is coupled to, but electrically isolated from, the target 72. The extension tube 74 is grounded by a connection with a grounding terminal G. The bias aperture 70 is energized with a negative charge V-. The support member 78 defines an interior passageway (not shown) for the circulation of cooling fluid.

The support member 78 also supports a filament feed 80 electrically coupled to a set of filaments (not shown). The filaments extend into the target 72 and, when energized, emit high energy electrons which are accelerated into an interior region of the target 72. The high energy electrons impact the interior wall of the target 72. The collisions of the high energy electrons with the target interior wall result in the emission of low energy electrons or so-called secondary electron emission.

As the positively charged ions in the ion beam 14 pass through the negatively charged field set up in the interior region of the bias aperture 70, the beam undergoes an increase in the degree of beam divergence. The positively charged ions have a natural repulsive force on each other because of their like charges. Passing the beam 14 through the bias aperture increases beam divergence.

Collisions between ions in the ion beam 14 and residual gas atoms create low energy electrons which makes the transport of a high density ion beam possible. Despite this space charge neutralization, the beam potential is higher than desirable. Circuitry (not shown) etched on the doped wafers is susceptible to positive charging damage from too high of beam potential. Low energy secondary electrons generated by the ion beam neutralization apparatus 44 are attracted to the positively charged ion beam 14 and further lower the beam potential. This reduces the probability of charging damage to the circuitry. The biased aperture 70 functions as a gate to prevent any positive charge accumulating on the wafers from depleting the ion beam 14 upstream of the ion beam neutralization apparatus 44 of neutralizing electrons. Were such a depletion to occur, the ion beam 14 would blow up due to space charge and transport would become very inefficient.

A gas feed line 82 extends through the mounting plate 76 and the target 72. Low concentrations of argon gas are injected into the interior region of the target via the gas feed line 82. The emission of secondary electrons is enhanced by the presence of the argon gas.

As can be seen in FIG. 1, a downstream end of the extension tube is adjacent the implantation chamber 17 where wafers supported by a wafer support 83 (FIG. 8) are implanted with ions. The wafers are frequently selectively coated with photoresist material prior to ion beam treatment. The photoresist is primarily hydrocarbon material. As the ions impact the wafer surface, particles of the photoresist coating are dislodged from the wafer and settle on the wafer support 83. Because of the proximity of the extension tube 74 to the implantation chamber 17, photoresist also condenses on inner and outer surfaces of the extension tube 74 during operation of the implanter.

Rotatably supported within the implantation chamber 17 is a disk shaped wafer support 83. Wafers to be treated are inserted into the chamber 17 and positioned near a peripheral edge of the wafer support and the support is rotated by a motor (not shown) at about 1200 RPM. The ion beam 14 impinges and treats the wafers as they rotate in a circular path. The implantation station 16 is pivotable with respect to the housing 50 and is connected thereto by a flexible bellows 92 (FIG. 1). The ability to pivot the implantation station 16 permits adjustments to the angle of incidence of the ion beam 14 on the wafer implantation surface.

In Situ Cleaning of Implanter

During operation of the implanter 10, contaminant materials in the form of dopant material and undesirable species of ions build up on surfaces of implanter components adjacent the ion beam 14, for example, the upstream facing surface of the resolving plate 52, the upstream facing surface of the quadruple assembly shield plate 64. In addition, photoresist material builds up on the interior surfaces of the ion beam neutralization apparatus target 72 and the extension tube 74 of the beam neutralizer.

Photoresist residue build up on the ion beam neutralization apparatus 44 interferes with proper operation of the apparatus. The build up of contaminant materials on the resolving plate 52 and quadruple assembly shield plate 64 eventually flakes off creating discharges and particle problems. Additionally, residue build up around the resolving plate aperture 56 causes desirable ions near the outer extremities of the beam path D', D" to strike and dislodge the built up residue. Beamstrike of residue will dislodge both ions and neutral atoms through sputtering. The dislodged ions can be accelerated by a post analysis acceleration field and thus become implanted in the wafer. The dislodged neutral atoms can drift to the wafer surface and become imbedded.

Contaminant materials built up on the upstream facing surface of the resolving plate 52, the upstream facing surface of the quadruple assembly shield plate 64 and the interior surfaces of the ion beam neutralization apparatus 44 may be cleaned in situ by misdirecting the ion beam 14 causing the ion beam to strike the contaminant materials on the surfaces to be cleaned. Ions traveling along the misdirected ion beam will impact and dislodge the contaminant materials. The misdirection of the ion beam 14 preferably is effected by mistuning the mass analyzing magnet 22 causing it to direct the ion beam to strike interior surfaces to be cleaned.

Mistuning of the magnet 22 is implemented by the control electronics 11 by changing the current through the field windings of the magnet 22. Advantageously, the control electronics will be programmed to adjust the current through the magnet coils in a continuously changing, repetitive pattern to cause the ion beam 15 to repetitively sweep over an area of the implanter interior surfaces to be cleaned. The cleaning area is swept across a sufficient number of times to effect dislodgement of all contaminants deposited on a surface of the area.

Alternately, the biasing voltage applied to the suppression electrode 26 of the set of electrodes 24 may be varied in a repetitive pattern to misdirect the ion beam 14 causing it to sweep over a cleaning area and strike contaminant materials.

During operation of the implanter 10, argon gas is often used as the source gas introduced into the plasma chamber to generate ions. For cleaning contaminant with the ion beam using argon as the ion beam source gas has proven undesirable. Argon dislodges contaminant material only by sputtering. However, some of the sputtered material will redeposit on other implanter surfaces through condensation. Thus, in situ cleaning of implanter components using an argon ion beam may result in redistribution of contaminant material if it settles before the vacuum pumps can remove it from the implanter.

Instead of using argon as the source gas when an in situ cleaning is to be performed, a reactive gas such as oxygen, hydrogen or fluorine is used as the source gas. Dislodging contaminant material with such an ion beam results in a chemical reaction between the ions in the ion beam 14 and the contaminant material. The chemical reaction results in the creation of a volatile species of the contaminant material. This volatile species of contaminant material can be pumped out of the implanter by the vacuum pumps 21 and vented outside the implanter. For example, if boron 10 is the contaminant material adhering to the resolving plate 52, using hydrogen as the source gas would result in the dislodged contaminant material being converted to $B_2H_6$ which can be easily pumped out of the implanter. Alternately, if fluorine were used as the source gas, the dislodged boron 10 contaminant material would be converted to $BF_3$ and then pumped out of the implanter.

Some photoresist contaminant material contains hydrocarbon atoms, oxygen would be used as the source gas. The dislodged photoresist material would be converted to $CO_2$ and $H_2O$.

In addition to mistuning the magnet 22, it is possible to allow the ion beam to diverge thereby increasing an area struck by or swept across by the ion beam 14. By operating the electron shower 44 with the bias aperture 70 turned on and the target 72 turned off, the beam is allowed to spread. This mode of operation causes a "blow up" of the ion beam 14 as it passes through the bias aperture 70 and, since the beam is not subsequently neutralized by electron emissions as it passes through the target 72 and the extension tube 74, the ions remain positively charged and tend to diverge to an even greater extent in the extension tube and downstream from the extension tube because of the like charges of the ions.

The process of dislodging contaminants using chemically reactive gas ions is described in a publication entitled "The Basics of Plasmas" by Dr. David C. Hinson, Copyright 1984, Materials Research Corporation of Orangeberg, N.Y., which is incorporated herein by reference.

In a confined plasma free electrons tend to escape to conductive surfaces that confine the plasma to establish a net negative current flow from the plasma to those surfaces. This loss of negative charge in the plasma volume charges the plasma up to a positive potential Vp. A collection of positively charged ions and electrons cannot coexist in a volume indefinitely since the electrons will recombine with the ions. This means that in order to maintain a plasma, ions and electrons must be constantly generated within the plasma by an external source of energy.

A plasma dark space sheath is defined as a region surrounding a plasma in which an electric field is established to retard electron loss from the plasma volume. This sheath is set up by application of an electric potential to conductors that bound the plasma. In the dark space sheath electrons are "rejected" by the electric field of either an external applied voltage or the potential of the plasma with respect to ground. The region is called a dark space due to the lack of electrons that could recombine with ions to give off light referred to as a glow discharge.

Ions within the plasma are accelerated by the dark space sheath field toward the bounding surface. In reactive ion etching, chemically reactive gas ions are directed toward the etching surface, where they combine with surface material, forming a volatile compound that is pumped away with the gas. The attractive "dark space" force acting on the ions is less important in an ion implanter since the ions of the beam 14 will strike surfaces of the implanter due to their movement from the source to the implantation chamber.

Figure 8:
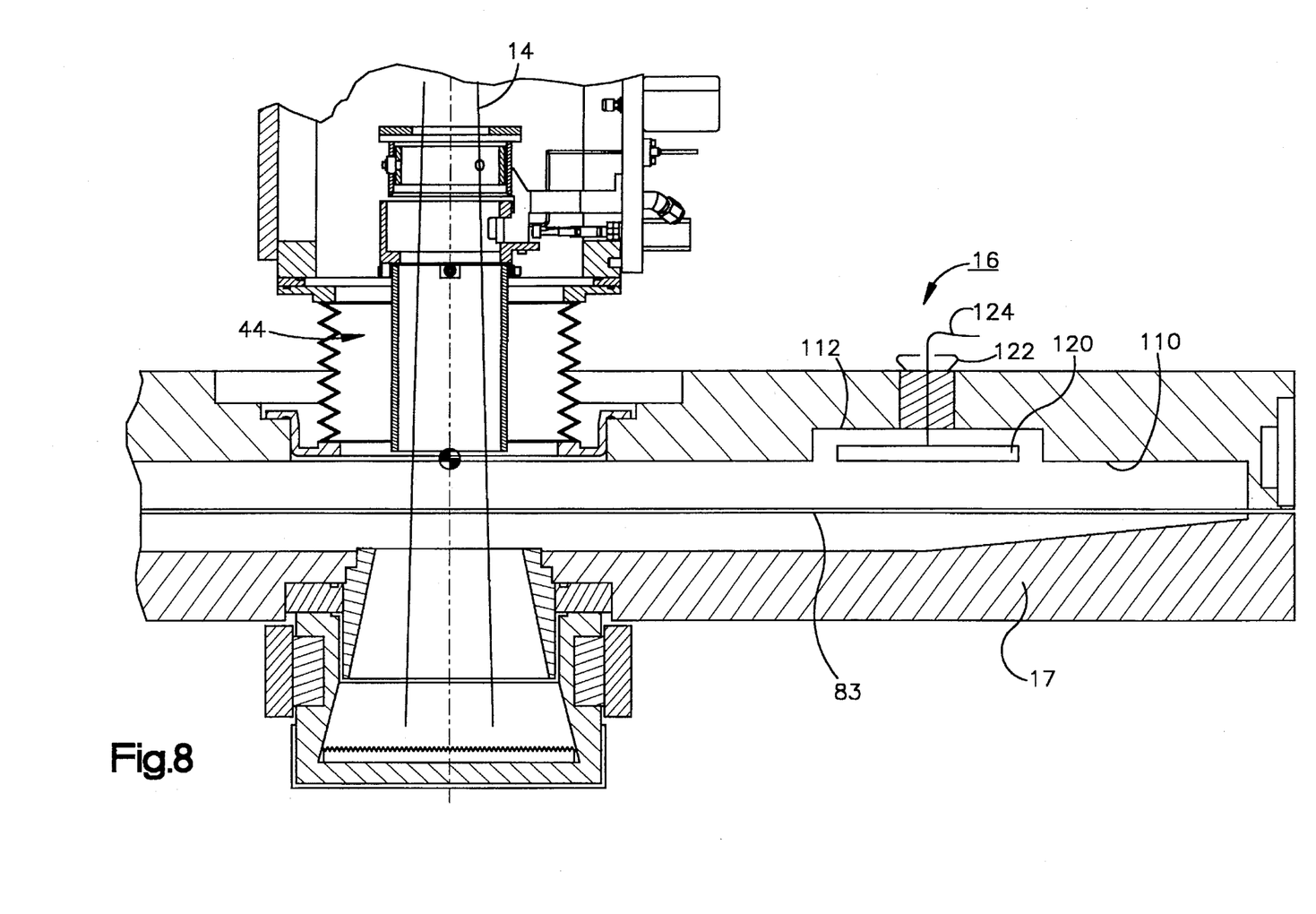
FIG. 8 is an enlarged section view of a portion of an ion implanter chamber having an electrode for implementing glow discharge cleaning of the ion implantation chamber.

With this background on the process of attracting ions to a surface to be cleaned, reference is now made to the FIG. 8 enlarged section view of the ion implantation chamber. The chamber 17 is bounded by an interior wall 110 having a cutout 112 spaced from the region of the wafer support 83. In accordance with a first technique for ion reactive cleaning, the support 83 is used as a negative counter electrode. In this case the metal support 83 receives ion bombardment and would be cleaned. A second technique is to use an additional conductive electrode 120 supported within the cutout 112 as a positive electrode by electrically biasing the electrode 120 while maintaining the disk 83 in electrical isolation from the chamber 17. This second technique would make the disk 83 and the chamber interior both cathodes and would clean both the interior of the process chamber and the disk support for the wafers. An insulating electrical feedthrough 122 and high voltage input 124 are required for this application. The high voltage input provides a voltage of approximately 200 volts and the implantation chamber and support disk are grounded.

Other portions of the beam line from the source to the chamber can also be relatively biased to attract ions to surfaces not directly adjacent the beam 14. The beam neutralizer 40 has electrical connections that can be relatively biased to control the attraction of ions to its components. Additionally, the electrodes 24, 26, 28 in the vicinity of the source 12 can be relatively biased to attract ions emitted by the source to clean residual contaminants.

Figure 6:
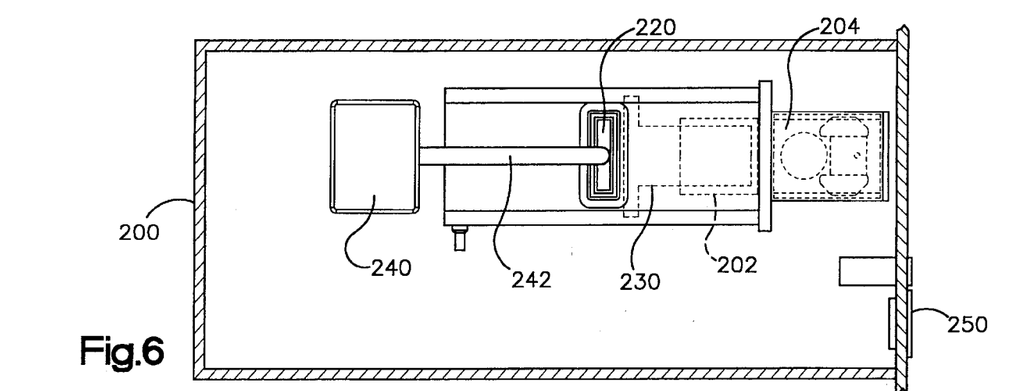
FIG. 6 is a top plan view of an ion beam implanter adapted for use in implanting flat panels for use in flat panel displays.
Figure 7:
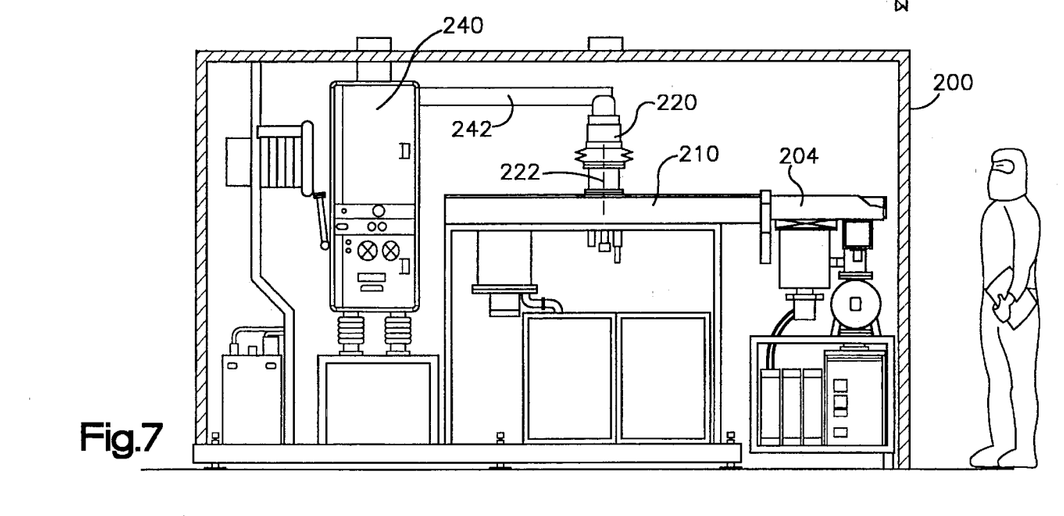
FIG. 7 is an elevation view of an ion beam implanter adapted for user in implanting flat panels for use in flat panel displays.

Turning to FIGS. 6 and 7, an ion implanter 200 is depicted that has special application in the ion implantation of flat panel displays. Flat panels 202 are moved through a load lock 204 into a process chamber 210 that is evacuated during ion implantation. The panels have dimensions much greater than silicon wafers treated with the implanter 10 described in conjunction with FIGS. 1–5. As an example, glass panels coated with amorphous silicon can have dimensions of about 55×80 centimeters.

The implanter 200 includes a source chamber 220 for creating an ionized gas plasma. The ions within the source chamber 220 exit through multiple apertures that create ion beamlets that combine to form a ribbon shaped ion beam 222 having a width slightly greater than the smaller dimension of the panels 202 in the implantation chamber.

The implanter 200 of FIGS. 6 and 7 includes a panel conveyor 230 for moving the panels 202 through the beam at a controlled rate to uniformly treat the panels. Gas for creating the plasma is routed from a source 240 through a conduit 242 connected to the source chamber 220. The source includes multiple different gas sources. This allows multiple different gases to be ionized in the source chamber 220.

The beam 222 follows a shorter, essentially straight line path from the chamber 220 to the implantation chamber 210. No magnet is required to bend the ion beam 222. Contaminants such as photoresist can accordingly reach the region of the source chamber 220. This makes an ability to relatively bias extraction electrodes used to attract ion beamlets from the source chamber important. By relatively biasing these electrodes, chemical etching of the electrodes can be achieved.

Choice of the material to be routed into the source chamber as well as control of other process variables is accomplished by an operator who enters commands by means of an operator console 250 on the side of the implanter. This console 250 can be used to control the manner in which contaminant cleaning is performed as well as the means by which flat panels are treated.

While the present invention has been described in some degree of particularity, it is to be understood that those of ordinary skill in the art may make certain additions or modifications to, or deletions from, the described present embodiment of the invention without departing from the spirit or scope of the invention, as set forth in the appended claims.

I claim:

1. A method for removing contaminant material adhering to interior surfaces of an ion beam implanter, the method comprising the steps of:

a) extracting ions from source materials and forming the ions into an ion beam that traverses a beam path through an evacuated region along a trajectory to an ion implantation chamber;

b) adjusting the trajectory of the ion beam to cause the ion beam to strike interior surfaces of the implanter in contact with the evacuated region to dislodge the contaminant material from the interior surfaces; and c) removing the dislodged contaminant material from the evacuated region of the implanter.

2. The method of removing contaminant material set forth in claim 1 wherein the ion beam implanter includes a mass analyzing magnet generating a magnetic field through which the ion beam passes, and wherein the adjusting step comprises the step of altering a direction of the ion beam as the beam passes through the magnetic field to direct the ion beam to strike the interior surfaces of the implanter.

3. The method of removing contaminant material set forth in claim 2 further comprising the step of tuning of the mass analyzing magnet to direct the ion beam to strike the interior surfaces, wherein the step of tuning includes the step of varying the tuning of the mass analyzing magnet in a selected repetitive pattern such that the ion beam repetitively sweeps across an area of the interior surfaces to be cleaned.

4. The method of dislodging deposited contaminant material set forth in claim 3 including the additional step of selectively energizing an ion beam neutralization apparatus surrounding a portion of the path of travel so as to increase an area of the interior surfaces to be cleaned.

5. The method of removing contaminant material set forth in claim 1 wherein the ion beam implanter includes a set of electrodes disposed around a portion of the ion beam path and the step of adjusting is performed by adjustably energizing at least one electrode to alter a direction of the ion beam as it passes through the electrodes to cause the ion beam to strike the interior surfaces of the ion beam implanter.

6. The method of removing contaminant material set forth in claim 5 further comprising the step of adjusting a level of energization of at least one electrode in the set of electrodes to direct the ion beam to strike the interior surfaces, wherein the step of adjusting the level includes the step of varying the level of energization in the at least one electrode a selected repetitive pattern such that the ion beam repetitively sweeps across an area of the interior surfaces to be cleaned.

7. The method for removing contaminant material set forth in claim 1 wherein the source materials include at least one of oxygen gas, hydrogen gas and fluorine gas.

8. The method for removing contaminant material set forth in claim 1 wherein the contaminant material comprises a boron isotope and the source materials include at least one of oxygen gas and hydrogen gas.

9. The method for removing contaminant material set forth in claim 1 wherein the contaminant material comprises photoresist material and the source materials include fluorine gas.

10. The method for removing contaminant material set forth in claim 1 where the ion beam implanter includes an ion beam neutralizer through which the beam path passes that is selectively actuated to cause divergence of the ion beam and selectively actuated to generate electron emissions to neutralize the ion beam and wherein the step of adjusting the trajectory is performed by directing the ion beam to strike the interior surfaces by causing divergence of the ion beam.

11. The method of removing contaminant material set forth in claim 1 wherein the ions extracted from the source material chemically bond with the contaminant material as the contaminant material is dislodged, 12. The method of removing contaminant material set forth in claim 1 wherein the step of directing the ion beam to strike the interior surfaces includes the step of increasing beam divergence to increase an area struck by the beam.

13. A method of dislodging deposited contaminant material from interior surfaces of an ion beam implanter, the method comprising the step of adjusting a magnetic field strength of a mass analyzing magnet through which ions moving along a path of travel from an ion source to an implantation station to deflect the ions along paths that cause ions to strike the interior surfaces thereby dislodging the deposited contaminant material.

14. The method of dislodging deposited contaminant material set forth in claim 13 wherein the magnetic field strength is varied in a repetitive pattern causing the ions to repetitively sweep across an area of the interior surfaces to be cleaned.

15. The method of dislodging deposited contaminant material set forth in claim 13 wherein the ions striking the interior surfaces create volatile species of the contaminant material as the contaminant material is dislodged.

16. The method of dislodging deposited contaminant material set forth in claim 13 wherein the mass analyzing magnet includes field windings and the magnetic field strength of the mass analyzing magnet is adjusted by changing a current flow through the field windings, 17. The method of dislodging deposited contaminant material set forth in claim 13 wherein the method includes the additional step of removing the dislodged contaminant material from the implanter.

18. The method of dislodging deposited contaminant material set forth in claim 13 wherein the contaminant material comprises photoresist material and the ions are generated from source materials including fluorine gas.

19. The method of dislodging deposited contaminant material set forth in claim 13 wherein the ions moving along the deflected paths of travel are subjected to an electric field which increases a divergence of the paths of travel of the ions.

20. An ion implanter for treating a workpiece comprising:
a) an ion source for providing ions and for emitting said ions from a source chamber having one or more ion exit apertures;
b) electrode structure positioned in relation to the one or more ion exit apertures of the source chamber for causing ions exiting the source chamber to form an ion beam;
c) ion beam defining structure bounding an evacuated region that defines an ion beam travel path from the electrode structure;
d) an ion implantation chamber including structure for supporting a workpiece that intercepts the ions entering the implantation chamber after traversing the beam travel path from the source to the implantation chamber;
e) a material source for introducing ionization materials into the ion source chamber which are ionized and leave the source chamber to chemically interact with contaminants that contact the structure bounding the evaluated region of the ion beam implanter during ion beam treatment of workpieces placed within the ion implantation chamber;
f) an implantation controller for controlling ion beam movement through the evacuated region from the source to the implantation chamber; and
g) a pump for removing dislodged contaminant material from the evacuated region of the ion implanter.

21. The apparatus of claim 20 wherein the ion source introduces a material that chemically interacts with the contaminants.

22. The apparatus of claim 20 wherein the ion source comprises a chamber for providing multiple beam portions which combine to form a ribbon beam that traverses a travel path to the ion implantation chamber and wherein the workpiece comprises a flat panel having a width less than the width of the ribbon beam and additionally comprising means for moving the flat panel back and forth through the ribbon beam.

23. A method for removing contaminant material adhering to interior surfaces of an ion beam implanter, the method comprising the steps of:
a) extracting ions from source materials that combine with contaminant materials to form compounds made up of constituents of the ion source material and the contaminant materials;
b) forming the ions into an ion beam that traverses a beam path through an evacuated region along a trajectory to an ion implantation chamber;
c) controlling the ion beam to cause the ion beam to strike interior surfaces of the implanter in contact with the evacuated region to dislodge the contaminant material from the interior surfaces and form said compounds; and
c) removing the compounds from the evacuated region of the implanter.

24. Apparatus for removing contaminant material adhering to interior surfaces of an ion beam implanter comprising:
a) means for extracting ions from source materials and forming the ions into an ion beam that traverses a beam path through an evacuated region along a trajectory to an ion implantation chamber;
b) means for adjusting the trajectory of the ion beam to cause the ion beam to strike interior surfaces of the implanter in contact with the evacuated region to dislodge the contaminant material from the interior surfaces; and
c) means for removing dislodged contaminant material from the evacuated region of the implanter.

25. The apparatus for removing contaminant material set forth in claim 24 wherein the ion beam implanter includes a mass analyzing magnet generating a magnetic field through which the ion beam passes, and wherein the means for adjusting comprises means for altering a direction of the ion beam as the beam passes through the magnetic field to direct the ion beam to strike the interior surfaces of the implanter.

26. The apparatus for removing contaminant material set forth in claim 25 wherein the means for adjusting controls the mass analyzing magnet to direct the ion beam to strike the interior surfaces includes means for varying the tuning of the mass analyzing magnet in a selected repetitive pattern such that the ion beam repetitively sweeps across an area of the interior surfaces to be cleaned.

27. The apparatus for removing contaminant material set forth in claim 24 wherein the ion beam implanter includes a set of electrodes disposed around a portion of the ion beam path and wherein the means for adjusting means for adjustably energizing at least one electrode to alter the direction of the ion beam as it passes through the electrodes to cause the ion beam to strike the interior surfaces of the ion beam implanter.

28. The apparatus for removing contaminant material set forth in claim 27 comprising means for adjusting a level of energization of at least one electrode in the set of electrodes to direct the ion beam to strike the interior surfaces by varying the level of energization in the at least one electrode in a selected repetitive pattern such that the ion beam repetitively sweeps across an area of the ion implanter interior surfaces to be cleaned.

29. The apparatus of claim 24 wherein the source materials include at least one of oxygen gas, hydrogen gas and fluorine gas.

30. The apparatus of claim 24 wherein the contaminant material comprises a boron isotope and the source materials include at least one of oxygen gas and hydrogen gas.

31. The apparatus of claim 24 wherein the contaminant material comprises photoresist material and the source materials include fluorine gas.

32. The apparatus of claim 24 where the means for adjusting comprises an ion beam neutralizer through which the beam path passes that is selectively actuated to cause divergence of the ion beam and selectively actuated to generate electron emissions to neutralize the ion beam and wherein the step of adjusting the trajectory is performed by directing the ion beam to strike the interior surfaces by causing divergence of the ion beam.

33. The apparatus of claim 24 wherein the means for adjusting comprises means to increase beam divergence to increase a surface area of the implanter that is struck by the beam.

34. An ion implanter for treating a workpiece comprising:

a) an ion source for providing ions and for emitting said ions from a source chamber for ion treatment of a workpiece;

b) an ion implantation chamber having a support for a workpiece placed within the ion implantation chamber that intercepts the ions entering the implantation chamber after said ions traverse a beam travel path from the source to the implantation chamber;

c) ion beam defining structure bounding an evacuated region that defines the ion beam travel path from the ion source to the ion implantation chamber;

d) an implantation controller for controlling ion beam movement through the evacuated region from the ion source to the implantation chamber;

e) means for removing contaminant material from an evacuated region of the ion implantation chamber; and f) structure for in-situ removal of contaminants from the evacuated region within the ion implantation chamber comprising:

i) first and second conductive electrodes in contact with the evacuated region of the ion implantation chamber wherein one conductive electrode of said first and second conductive electrodes is positioned to promote formation of an ion plasma within the implantation chamber wherein ions in the plasma combine with contaminants at a region in close proximity to said one conductive electrode; and ii) biasing means for applying an electric potential between the first and second conductive electrodes to maintain the ion plasma in a region of the one conductive electrode.

35. The ion implanter of claim 34 wherein the first conductive electrode comprises the workpiece support wherein the ion implantation chamber comprises conductive inner walls and the second conductive electrode comprises a conductive electrode electrically isolated from the conductive inner walls bounding the evacuated region of the ion implantation chamber.

36. The ion implanter of claim 34 wherein the ion implantation chamber comprises conductive inner walls and the first conductive electrode is an electrode that is electrically isolated from the conductive inner walls of the ion implantation chamber and the second metallic member comprises said conductive inner walls.

* * * * *